(12) United States Patent
Katta

(10) Patent No.: US 8,183,959 B2
(45) Date of Patent: May 22, 2012

(54) VARIABLE CAPACITANCE CIRCUIT

(75) Inventor: Hiroshi Katta, Kyoto (JP)

(73) Assignee: Kyocera Corporation, Kyoto (JP)

( * ) Notice: Subject to any disclaimer, the term of this patent is extended or adjusted under 35 U.S.C. 154(b) by 734 days.

(21) Appl. No.: 12/304,719

(22) PCT Filed: Jun. 13, 2007

(86) PCT No.: PCT/JP2007/061933
§ 371 (c)(1),
(2), (4) Date: Dec. 12, 2008

(87) PCT Pub. No.: WO2007/145259
PCT Pub. Date: Dec. 21, 2007

(65) Prior Publication Data
US 2009/0128249 A1    May 21, 2009

(30) Foreign Application Priority Data
Jun. 13, 2006    (JP) ................... 2006-163026

(51) Int. Cl.
*H03H 7/00*    (2006.01)
(52) U.S. Cl. ...................... 333/174; 333/185
(58) Field of Classification Search .......... 333/170–172, 333/174, 185
See application file for complete search history.

(56) References Cited

U.S. PATENT DOCUMENTS

| | | | |
|---|---|---|---|
| 6,377,440 B1 * | 4/2002 | Zhu et al. ................ | 361/311 |
| 6,674,321 B1 | 1/2004 | York | |
| 7,092,232 B2 * | 8/2006 | Yamagata et al. .......... | 361/277 |
| 7,369,394 B2 * | 5/2008 | Kurioka .................. | 361/277 |
| 2004/0164819 A1 | 8/2004 | Mishima et al. .......... | 333/174 |
| 2004/0207456 A1 | 10/2004 | York ...................... | 327/530 |
| 2005/0104680 A1 | 5/2005 | Katta .................... | 333/32 |

(Continued)

FOREIGN PATENT DOCUMENTS

JP    2001-111387    4/2001

(Continued)

OTHER PUBLICATIONS

Office Action for corresponding PCT application PCT/JP2007/061933 lists the references above.

*Primary Examiner* — Robert Pascal
*Assistant Examiner* — Kimberly Glenn
(74) *Attorney, Agent, or Firm* — DLA Piper LLP (US)

(57) ABSTRACT

The invention relates to a variable capacitance circuit which achieves reduction in both of distortion and current consumption and furthermore achieves requirements of high power handling capability, cost reduction, and downsizing of the circuit. The variable capacitance circuit includes a first variable capacitance element unit having n pieces (where n is a natural number of two or more) of variable capacitance capacitor connected in series with respect to high frequency and in parallel with respect to direct current, each of the variable capacitance capacitors including one or more variable capacitance elements, each of which includes a dielectric layer with dielectric constant varying according to an applied direct-current voltage and a pair of electrodes sandwiching the dielectric layer therebetween, and a second variable capacitance element unit which has an applied voltage amplitude smaller than a voltage amplitude of high frequency signal applied to the first variable capacitance element unit, the second variable capacitance element unit including one piece of the variable capacitance elements or having m pieces (where m is a natural number smaller than n) of the variable capacitance elements connected.

15 Claims, 6 Drawing Sheets

U.S. PATENT DOCUMENTS

| | | | |
|---|---|---|---|
| 2005/0122660 A1 | 6/2005 | Yashima | 361/278 |
| 2007/0018750 A1 | 1/2007 | Katta | 333/32 |

FOREIGN PATENT DOCUMENTS

| | | |
|---|---|---|
| JP | 2004-165588 | 6/2004 |
| JP | 2005508096 T | 3/2005 |
| JP | 2005805096 T | 3/2005 |
| JP | 2005-101773 | 4/2005 |
| JP | 2005-150466 | 6/2005 |
| JP | 2005-184270 | 7/2005 |
| WO | WO 03/038996 A2 | 5/2003 |

\* cited by examiner

VARIABLE CAPACITANCE CIRCUIT

CROSS-REFERENCE TO THE RELATED APPLICATIONS

This application is a national stage of international application No. PCT/JP2007/061933 filed Jun. 13, 2007, which also claims benefit of priority under 35 USC 119 to Japanese Patent Application No. 2006-163026 filed Jun. 13, 2006, the entire contents of which are incorporated herein by reference.

TECHNICAL FIELD

The invention relates to a variable capacitance circuit having a variable capacitance element which has a dielectric body of which dielectric constant is varied by application of a direct-current voltage, and impedance, resonant frequency or the like are varied by variation of capacity, whereby circuit characteristics can be made variable, which variable capacitance circuit is used in a wireless communication device such as a mobile phone, and relates in particular to the variable capacitance circuit which has excellent characteristics such as small distortion and low current consumption.

BACKGROUND ART

There has been a conventionally-known circuit which incorporates an impedance element such as a capacitor, a resistance, an inductor, and a transmission line, with a variable capacitance diode, to change impedance, resonant frequency or the like and thereby provide desired circuit characteristics, thus allowing for switching of frequency bands and decreasing characteristic changes depending on use environment.

There has also been a circuit which is low in loss even at a high frequency with use of, instead of the variable capacitance diode, a variable capacitance element having a thin-film dielectric layer with dielectric constant varying with a direct-current voltage.

Furthermore, there has been disclosed a circuit having excellent characteristics such as a low loss even at a high frequency, power handling capability, and small distortion, with use of a variable capacitance element unit in which a plurality of variable capacitance elements are connected in parallel with respect to direct current and in series with respect to high frequency (refer to Japanese Unexamined Patent Publication JP-A 2005-101773).

However, the circuit employing the variable capacitance diode is allowed to be used only in a receiver or receiving circuit adapted for low power because the variable capacitance diode is low in power handling capability and experiences large distortion due to capacitance nonlinearity, that is, the circuit has problems of being not allowed to be used in a transmitter or transmitting circuit adapted for high power and furthermore of having a high loss at a high frequency.

In the circuit employing the variable capacitance element having the thin-film dielectric layer with dielectric constant varying with a direct-current voltage, the circuit loss can be lower because the loss in the variable capacitance element can be lower even at a high frequency, but the variable capacitance element has its capacitance varying even with a high frequency voltage and therefore has such a problem that distortion including waveform distortion and intermodulation distortion is larger in the case where the high frequency voltage is high.

In order to reduce the above distortion, high-frequency field strength of the variable capacitance element needs to be lowered to reduce the capacitance variation caused by the high frequency voltage, and to achieve this, it is effective to increase a thickness of the dielectric layer, but the increase in thickness of the dielectric layer reduces direct-current field strength, which causes problems of decreases in a rate of capacitance change and in a control width of the impedance, resonant frequency, or the like, of the circuit.

With a high frequency signal, the variable capacitance element carries an electric current more easily and therefore, in the case of using the variable capacitance element in the variable capacitance circuit, loss resistance may cause the variable capacitance element to generate heat and be broken during use, which causes a problem that the circuit has lower power handling capability to the high frequency signal. To deal with such a problem, it is also effective to increase the thickness of the dielectric layer and reduce a calorific value per unit volume, but the increase in thickness of the dielectric layer decreases the direct-current field strength, which causes problems of decreases in the rate of capacitance change and in the control width of the impedance, resonant frequency, or the like, of the circuit.

JP-A 2005-101773 discloses a circuit having a variable capacitance element unit in which a plurality of the variable capacitance elements having thin-film dielectric layers with dielectric constant varying with a direct-current voltage are connected in parallel with respect to direct current and in series with respect to high frequency. In the circuit, because the plurality of the variable capacitance elements are connected in parallel with respect to direct current, a predetermined direct-current voltage can be applied to each of the variable capacitance elements, which allows for desired impedance control by taking full advantage of the rate of capacitance change of each of the variable capacitance elements caused by the direct-current voltage. In addition, because the variable capacitance element unit has the plurality of the variable capacitance elements which are connected in series with respect to high frequency, the high frequency voltage to be applied to the variable capacitance elements is divided for the respective variable capacitance elements, with the result that the high frequency voltage applied to each of the variable capacitance elements receives the divided and thus reduced voltage, allowing for reduction of the capacitance variation for the high frequency signal in the variable capacitance element unit. Hence, in the circuit disclosed in JP-A 2005-101773, it is possible to reduce waveform distortion, intermodulation distortion, or the like, of the circuit. Furthermore, because the plurality of the variable capacitance elements are connected in series with respect to high frequency, the same effect is obtained as that obtained by increasing the thickness of the dielectric layer of the variable capacitance element, and the calorific value per unit volume due to the loss resistance of the variable capacitance element unit can be smaller, thus allowing for enhancement of the power handling capability of the circuit.

However, on the other hand, the variable capacitance element unit in the circuit disclosed in JP-A 2005-101773 has a large number of variable capacitance elements, therefore allowing for reduction of the high frequency voltage applied to each of the variable capacitance elements, but in this case, the large number of variable capacitance elements contributes to the tendency to increase the current consumption owing to the fact that the variable capacitance elements are connected in parallel with respect to direct current, and furthermore, when a large number of the variable capacitance elements are used, the variable capacitance circuit tends to grow in size and cost.

The increasing number of variable capacitance elements can reduce the waveform distortion, intermodulation distortion, or the like, of the circuit while increasing the current consumption, and among the demand characteristics of a circuit having the variable capacitance element unit, the reduction of distortion and the reduction of current consumption have an antinomic relation and it is therefore hard to satisfy both of these in particular, with the result that no satisfactory report has been made about a variable capacitance circuit which even achieves sufficient controls on the increases in cost and size of the variable capacitance circuit attributable to the increase in the number of variable capacitance elements.

DISCLOSURE OF INVENTION

The invention has been devised in view of the problems of conventional art as described above, and its object is to provide a variable capacitance circuit which satisfies both of reduction of distortion and reduction of current consumption and furthermore satisfies requirements of high power handling capability, cost reduction and size reduction of the circuit.

According to one of the invention, a variable capacitance circuit in which capacitance is controlled, comprises a first variable capacitance section; and a second variable capacitance section; wherein the first variable capacitance section comprised a first variable capacitance element unit including n pieces (where n is a natural number of two or more) of variable capacitance capacitors connected in series with respect to high frequency and in parallel with response to direct current, the variable capacitance capacitors comprise one or more variable capacitance elements, each of which includes a dielectric layer having dielectric constant varying according to an applied direct-current voltage and a pair of electrodes sandwiching the dielectric layer therebetween, and wherein the second variable capacitance section comprises a second variable capacitance element unit which has an applied a voltage amplitude smaller than a voltage amplitude of high frequency signal applied to the first variable capacitance element unit, and the second variable capacitance unit comprises one or m pieces (where m is a natural number smaller than n) of the variable capacitance capacitors connected, each of which includes a dielectric layer having a dielectric constant varying according to an applied direct-current voltage and a pair of electrodes sandwiching the dielectric layer therebetween.

Further, the invention provides a variable capacitance circuit in which capacitance value is controlled, comprising a first variable capacitance section and a second variable capacitance section, wherein the first variable capacitance section comprises a first variable capacitance element unit including: n pieces (where n is a natural number of two or more) of variable capacitance capacitors connected in series, each of which comprises one or more variable capacitance elements which include a dielectric layer having a dielectric constant varying according to an applied direct-current voltage, and a pair of electrodes sandwiching the dielectric layer therebetween; and a first bias line on a high potential side of the direct-current voltage and a second bias line on a low potential side of the direct-current voltage, the first bias line and the second bias line being alternately connected to both ends of a plurality of the variable capacitance capacitors and between the respective capacitors, and wherein the second variable capacitance section comprises a second variable capacitance element unit which has an applied voltage amplitude smaller than a voltage amplitude of high frequency signal applied to the first variable capacitance element unit, the second variable capacitance element unit comprising one or m pieces (where ma is a natural number smaller than n) of the variable capacitance elements connected in series, each of which includes a dielectric layer having a dielectric constant varying according to an applied direct-current voltage, and includes a pair of electrodes sandwiching the dielectric layer therebetween.

According to another one of the invention, a method of adjusting the number of variable capacitance elements in a variable capacitance circuit, comprises the steps of: measuring voltage amplitude values in a plurality of variable capacitance sections, each having one or plural variable capacitance elements, and then comparing the voltage amplitude values in the variable capacitance sections; and selecting two variable capacitance sections having different voltage amplitude values among the plurality of the variable capacitance sections, and then reducing the number of variable capacitance elements in one of the selected variable capacitance section, which has a smaller voltage amplitude value than the other of the selected variable capacitance section.

According to one of the invention, it is possible to provide the variable capacitance circuit including: the first variable capacitance element unit including n pieces of the variable capacitance capacitors connected in series with respect to high frequency and in parallel with respect to direct current, the variable capacitance capacitors comprises one or more variable capacitance elements; and the second variable capacitance element unit which has an applied voltage amplitude smaller than that applied to the first variable capacitance element unit and which therefore has very lower dependency of the number of variable capacitance elements on distortion than the first variable capacitance element unit and has the largely reduced number of variable capacitance elements, thereby allowing for reduction in occurrence of distortion and moreover reduction in current consumption and thus being excellent in power handling capability with a low loss and low current consumption, and it is furthermore possible to achieve reduction in cost for the variable capacitance circuit as well as reduction in size of the variable capacitance circuit.

BRIEF DESCRIPTION OF DRAWINGS

Objects, features, and advantages of the invention will be more explicit from the following detailed description taken with reference to the drawing, wherein.

BEST MODE FOR CARRYING OUT THE INVENTION

Figure 1:
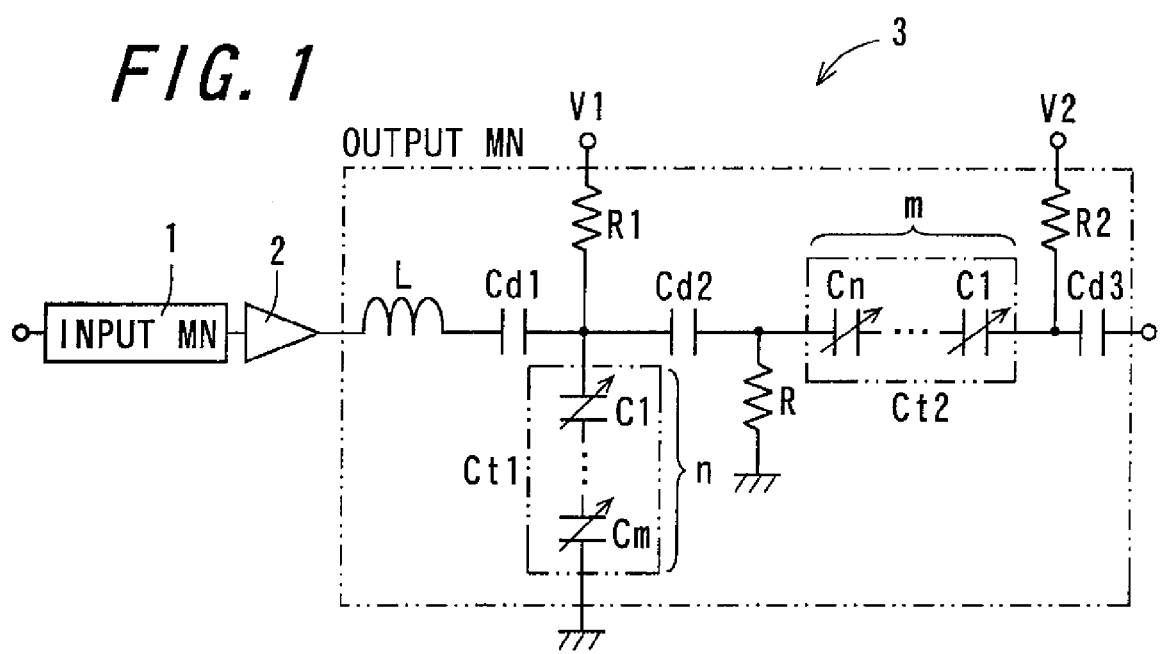
FIG. 1 is an equivalent circuit schematic showing a variable capacitance circuit according to one embodiment of the invention.

Now referring to the drawings, preferred embodiments of the invention are described below.

A variable capacitance circuit of the invention includes the first variable capacitance section and the second variable capacitance section, each of which has a capacitance varying with a direct-current voltage applied thereto. Herein, the first variable capacitance section indicates the first variable capacitance element unit having n pieces (where n is a natural number of two or more) of variable capacitance capacitors connected in series with respect to high frequency and in parallel with respect to direct current, which variable capacitance capacitors are composed of one or more variable capacitance elements, while the second variable capacitance section includes the second variable capacitance element unit being composed of one piece of the variable capacitance elements or having m pieces (where m is a natural number smaller than n) of the variable capacitance elements connected in series, and the second variable capacitance element unit has a smaller voltage amplitude applied thereto than a voltage amplitude of high frequency signal applied to the first variable capacitance element unit, and has a smaller number of variable capacitance capacitors than that of the first variable capacitance element unit.

The variable capacitance circuit of the invention includes the first variable capacitance element unit and the second variable capacitance element unit and in which their capacitance values are controlled. Having the capacitance values of the first variable capacitance element unit and the second variable capacitance element unit controlled includes the case of changing one of the capacitance values and not changing the other one of the capacitance values, as well as the case of changing none of the capacitance values.

When the capacitance values of the first variable capacitance element unit and the second variable capacitance element unit are controlled, then it becomes possible to obtain such use conditions or characteristics for variable capacitance circuit that one variable capacitance element unit had been conventionally unable to provide. Herein, the use conditions for variable capacitance circuit vary depending on each circuit of the variable capacitance circuit, and include a frequency condition, a temperature condition, and a power-consuming condition, for example. Moreover, the characteristics of variable capacitance circuit also vary depending on each circuit of the variable capacitance circuit, and include, for example: an impedance characteristic in the case where the variable capacitance circuit is a matching network; a pass characteristic and a damping characteristic in the case where the variable capacitance circuit is a resonant circuit; and a phase characteristic in the case where the variable capacitance circuit is a phase shifting circuit.

Further, in the invention, it is preferable that the second variable capacitance element unit has m pieces of the variable capacitance elements connected in series and that the second variable capacitance element unit has o pieces (where o is a natural number smaller than n) of the variable capacitance capacitors composed of one or more of the variable capacitance elements, connected in series with respect to high frequency and connected in parallel with respect to direct current.

Further, in the invention, it is preferable that the second variable capacitance element unit is a variable capacitance element unit having m pieces of the variable capacitance elements connected in series,
the second variable capacitance element unit comprising:
o pieces (where o is a natural number smaller than n) of variable capacitance capacitors connected in series, the variable capacitance capacitors each being composed of one or more variable capacitance elements; and
a first bias line on a high potential side of direct-current voltage and a second bias line on a low potential side of direct-current voltage, the first bias line and the second bias line being alternately connected to both ends of a plurality of the variable capacitance capacitors and between the respective capacitors.

Further, in the invention, it is preferable that in the variable capacitance circuit, the voltage amplitude of high frequency signal applied to the first variable capacitance element unit is maximum, and the voltage amplitude of high frequency signal applied to the second variable capacitance element unit is minimum.

Further, in the invention, it is preferable that circuits are connected to an input side and an output side, respectively, of the variable capacitance circuit, and the variable capacitance circuit is operated as a matching network for matching impedance between the input-side circuit and the output-side circuit, by using capacitance variation of the variable capacitance elements.

Further, in the invention, it is preferable that the variable capacitance circuit is operated as a resonant circuit for changing a resonant frequency of a high frequency signal, by using capacitance variation of the variable capacitance elements.

Further, in the invention, it is preferable that circuits are connected to an input side and an output side, respectively, of the variable capacitance circuit, and the variable capacitance circuit is operated as a phase shifting circuit for changing a phase difference between a high frequency signal from the input-side circuit and a high frequency signal to the output-side circuit, by using capacitance variation of the variable capacitance elements.

<Comparison of the Number of Variable Capacitance Elements (the Number of Variable Capacitance Capacitors) Between the First Variable Capacitance Element Unit and the Second Variable Capacitance Element Unit>

The variable capacitance circuit of the invention represents a variable capacitance circuit which satisfies a condition that the voltage amplitude of high frequency signal applied to the second variable capacitance element unit is smaller than the voltage amplitude of high frequency signal applied to the first variable capacitance element unit and which moreover satisfies a condition that the number m of the variable capacitance elements in the second variable capacitance element unit (the number o of the variable capacitance capacitors in the case of the second variable capacitance element unit A') is smaller than the number n of the variable capacitance capacitors in the first variable capacitance element unit. Herein, the high frequency signal applied represents a frequency signal of 300 MHz or more, which is a main signal among the high frequency signals applied to the variable capacitance circuit of the invention. For example, in the case where a nonlinear device such as a transistor is connected to the input side of the variable capacitance circuit of the invention, the high frequency signal serving as a main signal and the high frequency signal such as a harmonic signal will be applied to the variable capacitance circuit by the nonlinear device, and in this case, the main signal is referred to as "high frequency signal applied" according to the invention.

The invention relates to the variable capacitance circuit that when the voltage amplitudes of the high frequency signals applied to the first variable capacitance element unit and the second variable capacitance element unit are different from each other, and the voltage amplitude in the first variable capacitance element unit is smaller than the voltage amplitude in the second variable capacitance element unit, the number of variable capacitance elements in the second variable capacitance element unit is smaller than the number of variable capacitance capacitors in the first variable capacitance element unit. And the number of variable capacitance elements in the first variable capacitance element unit and the second variable capacitance element unit are controlled based on levels of the voltage amplitude as described above, thereby allowing for a decrease in the total number of variable capacitance elements used for the variable capacitance circuit.

To be specific, as the voltage amplitude of the high frequency signal is smaller, the voltage amplitude to be applied to each of the variable capacitance elements in the variable capacitance element unit is divided and thereby becomes smaller, resulting in smaller distortion of each of the variable capacitance elements and therefore leading to a decrease in the required number of variable capacitance elements in the variable capacitance element unit.

Accordingly, the voltage amplitudes of the high frequency signals applied to the respective variable capacitance element units are measured or calculated, and their levels are then compared with each other so that the unit having lower dependency of the number of variable capacitance elements on characteristics of the variable capacitance circuit can be decreased in the number of elements therein.

In order to decrease the number m of variable capacitance capacitors in the second variable capacitance element unit to be smaller than the number n of variable capacitance elements in the first variable capacitance element unit as described above, it is particularly preferable to use a method of adjusting the number of variable capacitance elements, in which Steps (1) to (3) described hereinbelow are contained.

The adjusting method preferably includes: Step (1) of measuring (including calculating based on simulation) voltage amplitude values of high frequency signals respectively applied to a plurality of variable capacitance element units, and comparing the voltage amplitude values thus obtained; Step (2) of comparing the dependency of the number of variable capacitance capacitors in the first variable capacitance element unit on the characteristics of the variable capacitance circuit with the dependency of the number of variable capacitance elements in the second variable capacitance element unit having a smaller voltage amplitude of high frequency signal than that of the first variable capacitance element unit; and Step (3) of calculating the optimal element number of variable capacitance elements in the second variable capacitance element unit based on the above dependency. Note that as mentioned above, the high frequency signal applied represents a main signal among the high frequency signals applied to the variable capacitance circuit of the invention.

The plurality of variable capacitance element units in the above step (1) represents a unit having the variable capacitance elements connected in series, and includes a variable capacitance element unit having the variable capacitance capacitors, each of which is composed of one or more variable capacitance elements, connected in series with respect to high frequency and in parallel with respect to direct current.

The plurality of variable capacitance element units in the above Step (1) only need to be designed in the variable capacitance circuit so that the variable capacitance circuit having these units can be provided with desired characteristics, and positional relationship, between the variable capacitance element units in the variable capacitance circuit or positional relationship between the variable capacitance element unit and another component (such as an inductor or resistor) are not particularly limited. Herein, the desired characteristics represent, for example, characteristics required according to kinds of the circuit, and in the case of a matching network in an amplifier, these characteristics include a distortion degree (linearity), current consumption, and a gain. Note that the above-described variable capacitance circuit is designed in a circuit design process commonly-used among persons skilled in the art, and to be specific, the circuit is designed through a step of determining respective circuit characteristics (the capacitance values Ct and the circuit constants L of the respective variable capacitance element units) by simulation and/or actual measurement so that the desired characteristics can be obtained.

In Step (1), the plurality of variable capacitance element units having respective capacitance values matched with those obtained by the simulation and/or actual measurement are designed in a circuit. In this case, the variable capacitance element unit may be replaced by a capacitance element (fixed capacitance element) having the same capacitance value if the capacitance value is matched. In the case where the capacitance element is used, it should be replaced by the variable capacitance element unit having the same capacitance value before next Step (2).

In the above Step (1), when measuring the voltage amplitude values of high frequency signals respectively applied to the plurality of variable capacitance element units, the voltage amplitude values are measured by oscilloscopes which are connected to both ends of the respective variable capacitance element units.

Further, in the above Step (1), when calculating the voltage amplitude values of high frequency signals respectively applied to the plurality of variable capacitance element units, the voltage amplitude values are calculated by using a circuit simulator.

And the voltage amplitude values in respective variable capacitance element units, measured or calculated as above, are compared with each other to determine their level difference.

The first variable capacitance element unit in the above Step (2) represents a variable capacitance element unit having variable capacitance elements connected in series with respect to high frequency and in parallel with respect to direct current, and any unit including such connection can be the first variable capacitance element unit and it is particularly preferable to select a unit having the maximum voltage amplitude value among the plurality of the variable capacitance element units because desired distortion, power handling capability, etc. can be obtained.

The variable capacitance circuit characteristics in the above Step (2) include, for example, an adjacent channel power ratio (ACPR), a distortion characteristic such as a third-order intermodulation (IM3) distortion, or modulation and demodulation characteristic such as receiver sensitivity and a bit error rate.

In the above Step (2), the dependency of the number of variable capacitance element capacitors in a certain first variable capacitance element unit on variable capacitance circuit characteristics can be determined by, for example, plotting the number of variable capacitance capacitors in the first variable capacitance element unit and the variable capacitance circuit characteristics with the number of capacitors, and thereby obtaining their gradients (absolute values).

Moreover, the dependency of the number of variable capacitance element capacitors in the second variable capacitance element unit on variable capacitance circuit characteristics can be determined likewise. The dependency may be determined by measuring the variable capacitance circuit characteristics based on an actually produced variable capacitance circuit having the first variable capacitance element unit and the second variable capacitance element unit where the numbers of capacitors are set, and may also be determined by calculation based on simulation, etc.

Further, in the above Step (2), the second variable capacitance element unit represents a unit having a smaller voltage amplitude of high frequency signal than that of the first variable capacitance element unit, and any unit can be selected from the variable capacitance element units satisfying the above requirements and it is particularly preferable to select a unit having the minimum voltage amplitude value among the plurality of the variable capacitance element units because sufficient effect of reducing the current consumption can be obtained.

In the above Step (3), the number of variable capacitance elements in the variable capacitance element unit having low dependency among the dependency obtained in Step (2) is decreased to such a level that the variable capacitance circuit characteristics do not fall below the desired characteristics. Note that the dependency does not have to be checked in Step (2), and in such a case, on the basis of a result obtained by comparing the voltage amplitude values in Step (1), two variable capacitance elements having different voltage amplitude values will be selected so that the number of variable capacitance elements in the variable capacitance circuit with a smaller voltage amplitude value may be decreased.

Specific examples of the above adjusting method will be described below.

Specific Examples

A method of calculating the number of variable capacitance elements (the number of variable capacitance capacitors) in the second variable capacitance element unit will be specifically described hereinbelow, but such a calculating method is not limited to the following examples.

In the calculation, distortion of an output watching network of a variable capacitance circuit (in this case, an adjacent channel power ratio (ACPR1) acting as one of indicators for distortion characteristics) is calculated, followed by calculating in a circuit simulator the dependency of the number of capacitors in the first variable capacitance element unit Ct1 as well as the dependency at the number of capacitors in the second variable capacitance element unit Ct2, on the ACPR1.

The high frequency voltage inputted to the first variable capacitance element unit Ct1 and the second variable capacitance element unit Ct2 shown in FIG. 1 varies depending on the circuit constant being used or the like factor. The high frequency voltage inputted to the variable capacitance element unit can be calculated by the circuit simulator, etc. Note that FIG. 1 shows a high frequency power amplifier having: an input matching network (Input MN) denoted by reference numeral 1; a transistor denoted by reference numeral 2; and an output matching network (Output MN) denoted by reference numeral 3, the output matching network 3 being composed of: the first variable capacitance element unit denoted by Ct1; the second variable capacitance element unit denoted by Ct2; an inductor L; the first to third direct-current-limiting capacitance elements Cd1 to Cd3; and the first and second bias supply circuits R1 and R2.

In more detail, the input matching network 1, the transistor 2, and the output matching network 3 are electrically connected in series in this order in the high frequency power amplifier. In the output matching network 3, the inductor L, the first direct-current-limiting capacitance element Cd1, the second direct-current-limiting capacitance element Cd2, the second variable capacitance element unit Ct2, and the third direct-current-limiting capacitance element Cd3 are electrically connected in series in this order. The transistor 2 is electrically connected to the inductor L. To a connection point between the first direct-current-limiting capacitance element Cd1 and the second direct-current-limiting capacitance element Cd2, the first bias supply circuit R1 is electrically connected, and also an input terminal of the first variable capacitance element unit Ct1 is electrically connected while an output terminal of the first variable capacitance element unit Ct1 is grounded. To a connection point between the second direct-current-limiting capacitance element Cd2 and the second variable capacitance element unit Ct2, one terminal of an electrical resistance R is electrically connected while the other terminal of the electrical resistance R is grounded. To a connection point between the second variable capacitance element unit Ct2 and the third direct-current-limiting capacitance element Cd3, the second bias supply circuit R2 is electrically connected.

Using the circuit simulator manufactured by Agilent Technologies Inc., the simulation was conducted with the circuit constant=0.1 nH, Ct1 (at the direct-current control voltage of 0 V)=4.1 pF, and Ct2 (at the direct-current control voltage of 0 V)=4.1 pF, and where the high frequency signal to be inputted to the output matching network 3 was set at 1880 MHz and a cdma signal was set to have input power+30.5 dBm, with the result that the high frequency voltage applied to the second variable capacitance element unit Ct2 was 2.0 V at the maximum while the high frequency voltage applied to the first variable capacitance element unit Ct1 was 16.8 V at the maximum (Step 1).

Further, the distortion of the output matching network 3 can be calculated in the circuit simulator by measuring the voltage-capacitance characteristic of the variable capacitance element and fitting the obtained results with use of a bias equation shown in J. Appl. Phys. 33 (9), 2826 (1962) or J. Mat. Sci., Materials in Electronics 11, 645 (2000), followed by modeling it as a variable capacitance element unit.

Figure 2:
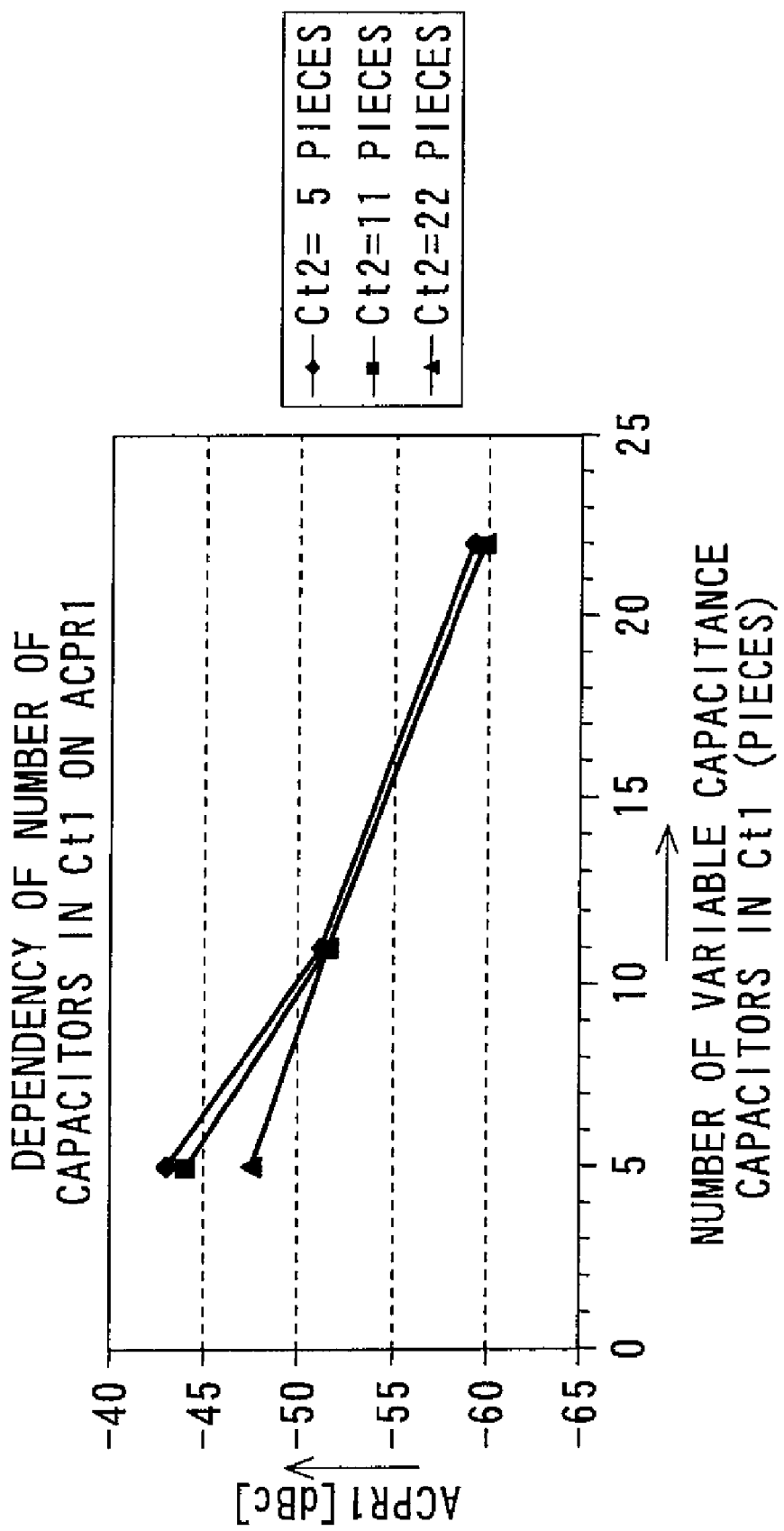
FIG. 2 is a view showing a calculated result of an adjacent channel leakage power ratio (ACPR1) of an output matching network shown in FIG. 1, which result indicates dependency of the number of variable capacitance capacitors in the first variable capacitance element unit Ct1 on the ACPR1.
Figure 3:
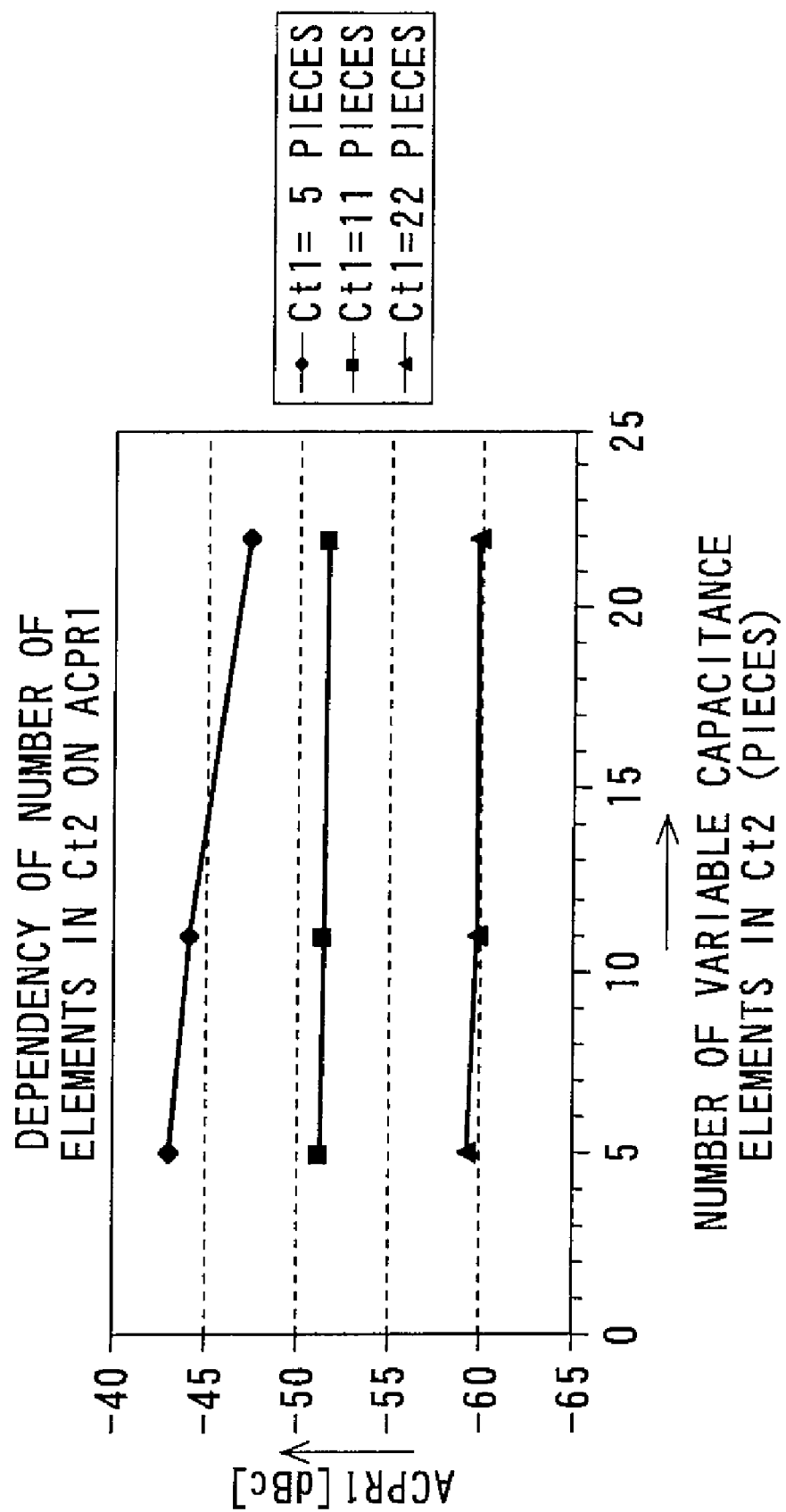
FIG. 3 is a view showing a calculated result of the adjacent channel power ratio (ACPR1) of the output matching network shown in FIG. 1, which result indicates dependency of the number of variable capacitance capacitors in the second variable capacitance element unit Ct2 on the ACPR1.

FIGS. 2 and 3 each show a calculated result of the adjacent channel power ratio (ACPR1) acting as one of indicators for the distortion of the output matching network 3 in the case where the number of variable capacitance capacitors of the first variable capacitance element unit Ct1 and the number of variable capacitance element unit Ct2 are respectively five, eleven, and twenty-two.

It can be seen that in FIG. 2, the first variable capacitance element unit Ct1 has high dependency on the ACPR1 because the increase in the number of variable capacitance capacitors decreases (improves) the ACPR1 while in FIG. 3, the second variable capacitance element unit Ct2 has very low dependency on the ACPR1 because no major change occurs in the number of variable capacitance elements (Step 2). In addition, as can be seen from FIG. 2, almost the same results are obtained for five and more variable capacitance elements of the second variable capacitance element unit Ct2 when the number of variable capacitance capacitors of the first variable capacitance element unit Ct1 is eleven and more (Step 3).

For example, in the case where the desired characteristic of the ACPR1 of the output matching network 3 is −50 dBc (or lower), and when the number of variable capacitance capacitors of Ct1 is eleven, the number of variable capacitance elements of Ct2 is usually set to be eleven as well to reduce the distortion, but the Ct2 which is small in a voltage amplitude of the high frequency signal, has very low dependency of the number of variable capacitance elements on the ACPR1 as is also obvious from FIG. 3, with the result that the number of various capacitance elements of the second variable capacitance element unit Ct2 can be five, that is, almost half the normal number, and the current consumption can be reduced.

As described above, in the variable capacitance circuit of the invention having the first variable capacitance element unit and the second variable capacitance element unit, the high frequency voltage applied to each variable capacitance element is decreased, which leads to reduction in the waveform distortion, intermodulation distortion, or the like, and furthermore, the current consumption can be reduced.

Preferred Embodiments of Variable Capacitance Circuit of the Invention

In the variable capacitance circuit of the invention, when there exist a plurality of variable capacitance element units each having the variable capacitance elements connected in series with respect to high frequency and in parallel with respect to direct current, it is preferable that the voltage amplitude of high frequency signal applied to each of the variable capacitance element units be maximum in the first variable capacitance element unit, further when there are contained a plurality of the variable capacitance element units each being composed of one piece of the variable capacitance elements or having a plurality of the variable capacitance elements connected in series, it is preferable that the voltage amplitude of high frequency signal applied to each of the variable capacitance element units be minimum in the second variable capacitance element unit. Herein, the high frequency signal applied represents a main signal among the high frequency signals applied to the variable capacitance circuit of the invention.

As a result of the above setting, the voltage amplitude of high frequency signal of the first variable capacitance element unit is maximum and moreover, the voltage amplitude of high frequency signal of the second variable capacitance element unit is minimum, therefore making it possible to obtain not only desired high frequency characteristics such as desired distortion and power handling capability but also a sufficient effect of reducing the current consumption.

That is to say, among the plurality of the variable capacitance element units in the variable capacitance circuit, the unit energized with the voltage of high frequency signal of which amplitude is maximum is the first variable capacitance element unit while the unit energized with the voltage of which amplitude is minimum is the second variable capacitance element, with the result that the occurrence of distortion can be considerably reduced and furthermore, the power consumption can be sufficiently reduced owing to the sufficient decrease in the number of variable capacitance elements in the second variable capacitance element unit.

<Matching Network, Resonant Circuit, and Phase Shifting Circuit>

The variable capacitance circuit of the invention has various functions and can be used as various circuits, and in particular, its preferred application is mainly a matching network, a resonant circuit, or a phase shifting circuit. This allows the first variable capacitance element unit Ct1 and the second variable capacitance element unit Ct2 provided in the variable capacitance circuit to easily control characteristics owing to capacitance components, with the result that in the case of the matching network, desired impedance matching can be achieved with desired frequency, temperature, power consumption, etc.; in the case of the resonant circuit, resonant frequency having desired characteristics can be set with desired frequency, temperature, power consumption, etc.; and in the case of the phase shifting circuit, a desired change in phase difference can be achieved with desired frequency, temperature, power consumption, etc.

For example, in the case of application to the matching network, the impedance matching is achieved with desired frequency, temperature, power consumption, etc., between an input side circuit and an output side circuit connected to the variable capacitance circuit, so as to obtain desired characteristics such as high power, high efficiency, and small distortion; in the case of application to the resonant circuit, the resonant frequency of high frequency signal is changed to a desired frequency; and in the case of application to the phase shifting circuit, the phase difference between the high frequency signal from the input side circuit and the high frequency signal to the output side circuit can be changed to a desired level. In addition to the above, the power consumption can be sufficiently reduced, with the result that in the case of being used on a portable terminal, the variable capacitance element circuit can be provided which can reduce drain on battery power and furthermore achieve reduction in cost and size of the portable terminal.

In the case of application to the matching network, the resonant circuit, or the phase shifting circuit, the variable capacitance circuit of the invention needs to have circuits connected respectively to an input side and an output side of the variable capacitance circuit. The circuits connected to the input side and the output side include, for example, an active device such as a transistor or an oscillator and a passive device such as a filter or an antenna.

Hereinafter, the variable capacitance element and the variable capacitance element unit will be described respectively in detail.

<Variable Capacitance Element>

The variable capacitance element is composed of a dielectric layer and a pair of electrodes between which the dielectric is sandwiched. The dielectric layer represents a thin-film dielectric layer of which dielectric constant varies with a direct-current voltage. The use of the variable capacitance element having the thin-film dielectric layer with dielectric constant varying allows for a low loss in the variable capacitance element unit even at a high frequency, so that a variable capacitance circuit loss can be lower.

For the electrodes, noble metals such as Au, Pt, and Ir are preferred, and the dielectric layer is preferably formed of $(Ba_x, Sr_{1-x})_y Ti_{1-y} O_{3-z}$ (BST) or the like material.

It is preferable that the variable capacitance element have the dielectric layer and the pair of electrodes formed on a low-dielectric insulating substrate. Note that for the insulating substrate, it is preferable to use a flat and highly insulating substrate made of MgO, alumina, sapphire, or $LaAlO_3$, for example.

The variable capacitance element can be produced by sequentially depositing a lower electrode, a dielectric layer, and an upper electrode on the insulating substrate with use of spatters or the like, followed by processing these into desired shapes, and resulting in a variable capacitance element composed of a dielectric layer and a pair of electrodes between which the dielectric layer is sandwiched.

<Variable Capacitance Element Unit>

(First Variable Capacitance Element Unit)

Figure 4A:
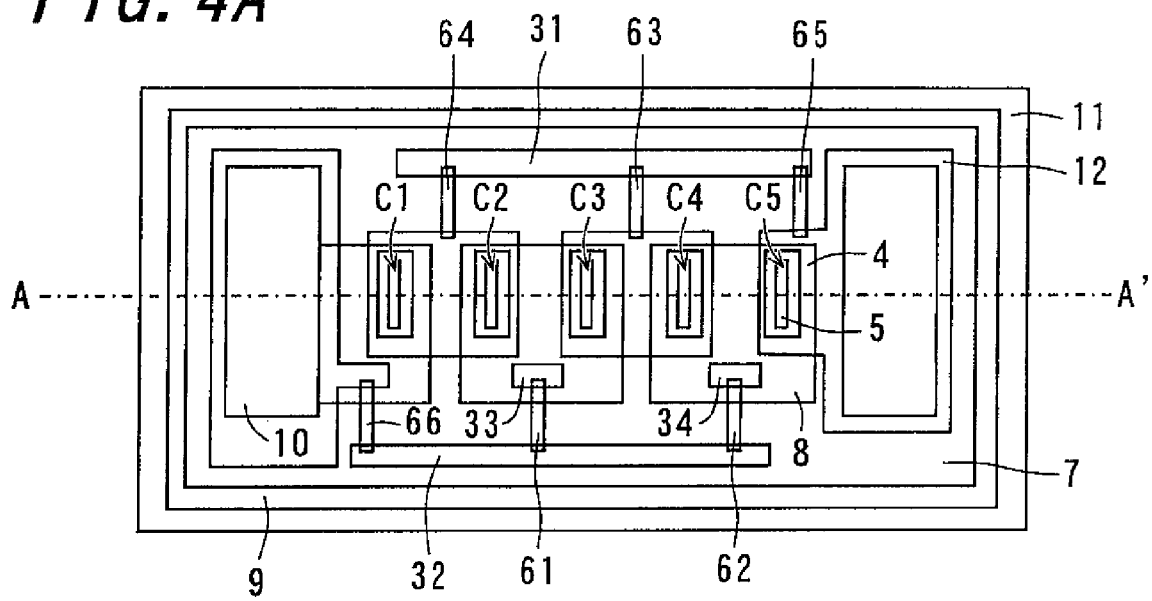
FIG. 4A is a perspective plan view showing one example of embodiment of a variable capacitance element unit having five variable capacitance elements connected in series.
Figure 4B:
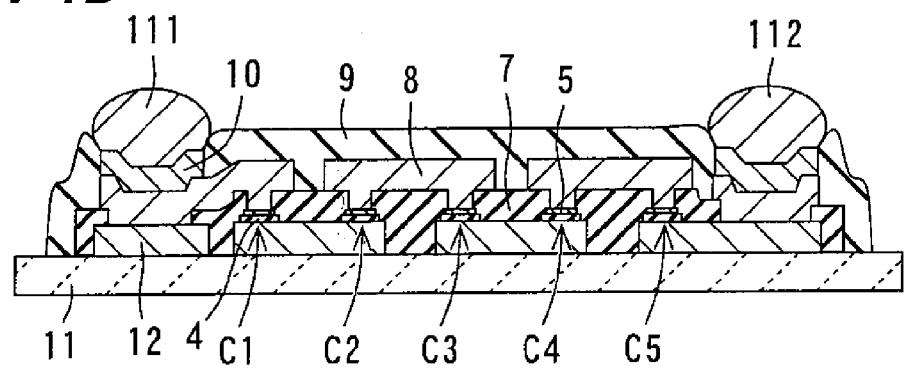
FIG. 4B is a sectional view taken on line A-A' of FIG. 4A.

The first variable capacitance element unit represents a unit which has n pieces (where n is a natural number of two or more) of variable capacitance capacitors each composed of one or more pieces of the variable capacitance elements, connected in series with respect to high frequency and in parallel with respect to direct current. It is preferable that the first variable capacitance element unit have a variable capacitance element, a bias line, and a thin-film resistor on one supporting substrate, especially for reasons such as easy handling, downsizing, and cost reduction. Herein, FIGS. 4A and 4B show one specific example of the first variable capacitance element unit having the variable capacitance element, the bias line, and the thin-film resistor on one supporting substrate. Note that FIG. 4A shows one example of the variable capacitance element unit of the invention, and reference symbols C1 to C5 denote the variable capacitance elements; reference numerals 31 to 34 denote conductor lines; reference numeral 4 denotes a thin-film dielectric layer; reference numeral 5 denotes an upper electrode; reference numerals 61 to 66 denote thin-film resistors, reference numeral 7 denotes an insulating layer; reference numeral 8 denotes an extraction electrode layer; reference numeral 9 denotes a protective layer; reference numeral 10 denotes a solder spread prevention layer; reference numeral 11 denotes a supporting substrate; reference numeral 12 denotes a lower electrode; and reference numerals 111 and 112 denote solder terminal portions. And FIG. 4B is a sectional view taken on line A-A' of FIG. 4A.

The variable capacitance capacitor in the invention represents a capacitor composed of one or more pieces of the variable capacitance elements, which satisfies the following requirement in the case where n pieces (where n represent a natural number of 2 or more) of the variable capacitance capacitors are connected and thereby constitute the first variable capacitance element unit, that the n pieces are connected in series with respect to high frequency and which furthermore satisfies the requirement that the same number, i.e., n pieces of capacitors are connected in parallel with respect to direct current.

Now, a specific example of the above-mentioned variable capacitance capacitor in the invention will be hereinbelow described based on FIGS. 1 and 5. Note that FIGS. 1 and 5 show mere examples to which the circuit configuration is not limited.

Figure 5A:
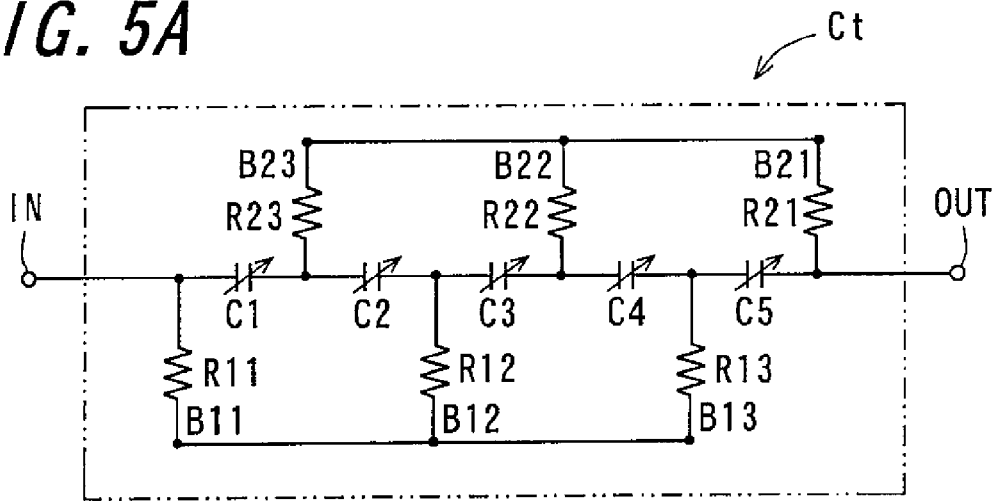
FIGS. 5A and 5B are equivalent circuit schematics each showing a variable capacitance element unit according to one embodiment of the invention.

FIG. 5A shows an equivalent circuit schematic having five variable capacitance elements, which is an equivalent circuit schematic of the variable capacitance element unit Ct having five variable capacitance capacitors composed of the variable capacitance elements, connected in series with respect to high frequency and in parallel with respect to direct current. Note that FIG. 5A shows the equivalent circuit schematic of the unit shown in FIGS. 4A and 4B.

Figure 5B:
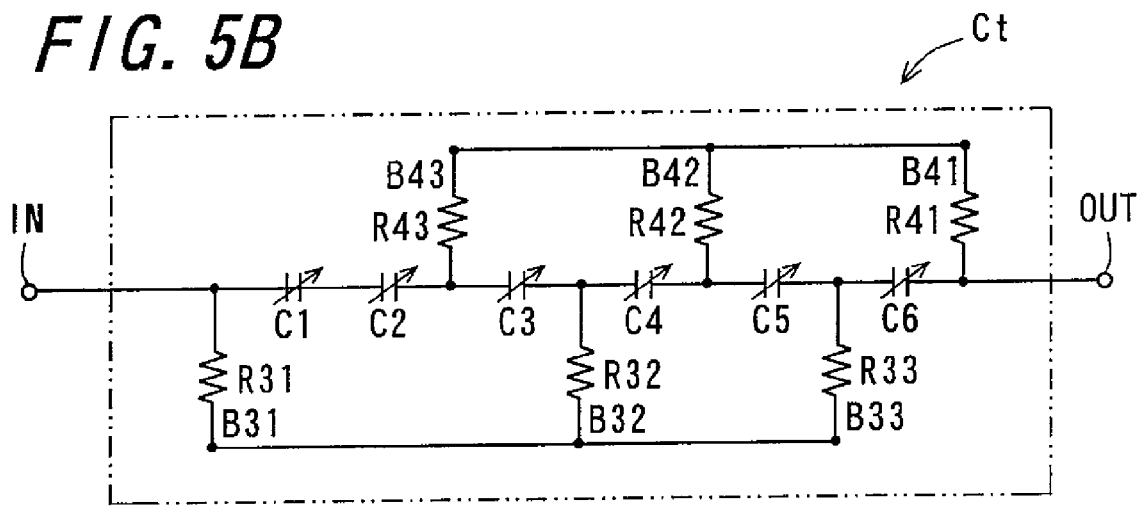

Further, FIG. 5B shows an equivalent circuit schematic having six variable capacitance elements, which is an equivalent circuit schematic of the variable capacitance element unit Ct having five variable capacitance capacitors composed of the variable capacitance elements, connected in series with respect to high frequency and in parallel with respect to direct current.

Note that in FIGS. 5A and 5B, reference symbols C1 to C6 all denote the variable capacitance elements; reference symbols B11 to B13 and B31 to B33 denote the first bias lines each containing at least a resistor component or an inductor component (which indicates the resistor components R11 to R13 and R31 to R33 in these figures); and reference symbols B21 to B23 and B41 to B43 denote the second bias lines each containing at least a resistor component or an inductor component (which indicates the resistor components R21 to R23 and R41 to R43 in these figures). The first bias lines B11 to B13 and B31 to B33 are located on a high potential side of direct-current voltage applied while the second bias lines B21 to B23 and B41 to B43 are located on a low potential side of direct-current voltage applied. Note that in the figures, higher potential of the direct-current voltage is applied to B11 to B13 and B31 to B33 as the first bias lines and lower potential of the direct-current voltage is applied to B21 to B23 and B41 to B43 as the second bias lines, and by contraries, lower potential of the direct-current voltage may be applied to B11 to B13 and B31 to B33 as the second bias lines and higher potential of the direct-current voltage may be applied to B21 to B23 and B41 to B43 as the first bias lines.

(Variable Capacitance Capacitors in the Case of Variable Capacitance Element Unit in FIG. 5A)

In FIG. 5A, the variable capacitance element unit Ct includes an input terminal IN, an output terminal OUT, five variable capacitance elements C1 to C5, three first bias lines B11 to B13, and three second bias lines B21 to B23. The five variable capacitance elements C1 to C5 are connected in series between the input terminal IN and the output terminal OUT. The first bias lines B11 to B13 are connected in parallel. The first bias line B11 is electrically connected to a connection point of the input terminal IN and the first variable capacitance element C1. The first bias line B12 is electrically connected to a connection point of the second variable capacitance element C2 and the third variable capacitance element C3. The first bias line B13 is electrically connected to a connection point of the fourth variable capacitance element C4 and the fifth variable capacitance element C5. The second bias lines B21 to B23 are connected in parallel. The second bias line B21 is electrically connected to a connection point of the fifth variable capacitance element C5 and the output terminal OUT. The second bias line B22 is electrically connected to a connection point of the third variable capacitance element C3 and the fourth variable capacitance element C4. The second bias line B23 is electrically connected to a connection point of the first variable capacitance element C1 and the second variable capacitance element C2.

That is to say, the first bias line B11 is electrically connected to an input-side terminal of the first variable capacitance element C1. The first bias line B12 is electrically connected to an input-side terminal of the third variable capacitance element C3. The first bias line B13 is electrically connected to an input-side terminal of the fifth variable capacitance element C5. The second bias line B21 is electrically connected to an output-side terminal of the fifth variable capacitance element C5. The second bias line B22 is electrically connected to an output-side terminal of the third variable capacitance element C3. The second bias line B23 is electrically connected to an output-side terminal of the first variable capacitance element C1. In the case of the configuration shown in FIG. 5B, the first to fifth variable capacitance elements C1 to C5 can be regarded as the first to fifth variable capacitance capacitors, respectively, as described later. Accordingly, the first bias lines B11 to B13 and the second bias lines B21 to B23 are alternately connected to both ends of a plurality of variable capacitance capacitors and between the respective capacitors. That is to say, the first bias lines B11 to B13 are electrically connected to the input-side terminals of the odd-numbered variable capacitance capacitors while the second bias lines B21 to B23 are electrically connected to the output-side terminals of the odd-numbered variable capacitance capacitors. In more detail, the first bias lines B11 to B13 electrically connect the input-side terminals of the odd-numbered variable capacitance capacitors with each other while the second bias lines B21 to B23 electrically connect the output-side terminals of the odd-numbered variable capacitance capacitors with each other.

In the case where the high frequency signal is applied to the variable capacitance element unit Ct in FIG. 5A corresponding to the first variable capacitance element unit, the high frequency signal will be applied through the variable capacitance elements C1 to C5 connected in series between the input terminal IN and the output terminal OUT of the variable capacitance element unit Ct. The resistor components R11 to R13 and R21 to R23 of the first bias lines B11 to B13 and the second bias lines B21 to B23 serve as high impedance components for impedance in the frequency region of high frequency signals in the variable capacitance elements C1 to C5, and therefore do not exert harmful influences on high frequency band impedance. As just described, in the variable capacitance element unit Ct, the five variable capacitance elements C1 to C5 can be regarded as the variable capacitance elements connected in series with respect to high frequency.

On the other hand, in the case of applying a direct-current voltage to the first variable capacitance element unit Ct1 in FIG. 1 where Ct of FIG. 5A is used as Ct1 of FIG. 1 and the input terminal IN of the variable capacitance element unit of FIG. 5A is used on a bias terminal V1 side while the output terminal OUT thereof is used on a ground side, and with reference also to FIG. 1, the direct-current voltage for controlling the capacitance component of the variable capacitance element C1 is supplied from a bias terminal V1 through a resistor component of the first bias supply circuit R1 and then through the first variable capacitance element C1 and the second bias lines B23 and B21, thus being applied between the bias terminal V1 and the ground. According to the voltage applied to the variable capacitance element C1, the first variable capacitance element C1 will have predetermined dielectric constant, with the result that a desired capacitance component can be obtained. Also to the second to fifth variable capacitance elements C2 to C5, the direct-current voltage is applied respectively through the first bias lines B11 to B13 and the second bias lines B21 to B23 as in the case of the first variable capacitance element C1. That is to say, the direct-current voltage for controlling the capacitance component of the second variable capacitance element C2 is applied between the bias terminal V1 and the ground by way of the first bias lines B11 and B12, the second variable capacitance element C2, and the second bias lines B23 and B21. The direct-current voltage for controlling the capacitance component of the third variable capacitance element C3 is applied between the bias terminal V1 and the ground by way of the first bias lines B11 and B12, the third variable capacitance element C3, and the second bias lines B22 and B21. The direct-current voltage for controlling the capacitance component of the fourth variable capacitance element C4 is applied between the bias terminal V1 and the ground by way of the first bias lines B11 and B13, the fourth variable capacitance element C4, and the second bias lines B23 and B21. The direct-current voltage for controlling the capacitance component of the fifth variable capacitance element C5 is applied between the bias terminal V1 and the ground by way of the first bias lines B11 and B13 and the fifth variable capacitance element C5. As just described, in the case where the direct-current voltage is applied to the variable capacitance element unit Ct, the direct-current voltage of which level is equal to that of the direct-current voltage applied to the first variable capacitance element unit Ct1 is applied to each of the five variable capacitance elements C1 to C5, with the result that the variable capacitance elements C1 to C5 can be regarded as variable capacitance elements connected in parallel with respect to direct current.

That is, in the circuit of FIG. 5A, the five variable capacitance elements are connected to each other in series with respect to high frequency and in parallel with respect to direct current, and therefore C1, C2, C3, C4, and C5 each serve as one variable capacitance capacitor in the invention. Hence, the variable capacitance element unit of FIG. 5A has the five various capacitance capacitors connected in series with respect to high frequency and in parallel with respect to direct current.

(Variable Capacitance Capacitors in the Case of Variable Capacitance Element Unit in FIG. 5B)

In FIG. 5B, the variable capacitance element unit Ct includes an input terminal IN, an output terminal OUT, six variable capacitance elements C1 to C6, three first bias lines B31 to B33, and three second bias lines B41 to B43. The six variable capacitance elements C1 to C6 are connected in series to a connection point of the input terminal IN and the output terminal OUT. The first bias lines B31 to B33 are connected in parallel. The first bias line B31 is electrically connected to a connection point of the input terminal IN and the first variable capacitance element C1. The first bias line B32 is electrically connected to a connection point of the third variable capacitance element C3 and the fourth variable capacitance element C4. The first bias line B33 is electrically connected to a connection point of the fifth variable capacitance element C5 and the sixth variable capacitance element C6. The second bias lines B41 to B43 are connected in parallel. The second bias line B41 is electrically connected to a connection point of the sixth variable capacitance element C6 and the output terminal OUT. The second bias line B42 is electrically connected to a connection point of the fourth variable capacitance element C4 and the fifth variable capacitance element C5. The second bias line B43 is electrically connected to a connection point of the second variable capacitance element C2 and the third variable capacitance element C3.

That is to say, the first bias line B31 is electrically connected to an input-side terminal of the first variable capacitance element C1. The first bias line B32 is electrically connected to an input-side terminal of the fourth variable capacitance element C4. The first bias line B33 is electrically connected to an input-side terminal of the sixth variable capacitance element C6. The second bias line B41 is electrically connected to an output-side terminal of the sixth variable capacitance element C6. The second bias line B42 is electrically connected to an output-side terminal of the fourth variable capacitance element C4. The second bias line B43 is electrically connected to an output-side terminal of the second variable capacitance element C2. In the case of the configuration shown in FIG. 5B, a group consisting of the first variable capacitance element C1 and the second variable capacitance element C2 can be regarded as the first variable capacitance capacitor, and the third to sixth variable capacitance elements C3 to C6 can be regarded as the second to fifth variable capacitance capacitors, respectively, as described later. Accordingly, the first bias lines B31 to 333 and the second bias lines B41 to B43 are alternately connected to both ends of a plurality of variable capacitance capacitors and between the respective capacitors. That is to say, the first bias lines B31 to B33 are electrically connected to the input-side terminals of the odd-numbered variable capacitance capacitors while the second bias lines B41 to B43 are electrically connected to the output-side terminals of the odd-numbered variable capacitance capacitors. In more detail, the first bias lines B31 to B33 electrically connect the input-side terminals of the odd-numbered variable capacitance capacitors with each other while the second bias lines B41 to B43 electrically connect the output-side terminals of the odd-numbered variable capacitance capacitors with each other.

In the case where the high frequency signal is applied to the variable capacitance element unit Ct in FIG. 5B corresponding to the first variable capacitance element unit, the high frequency signal will pass through the variable capacitance elements C1 to C6 connected in series between the input terminal IN and the output terminal OUT of the variable capacitance element unit Ct for the same reason as that in the above-mentioned case of FIG. 5A. As just described, in the variable capacitance element unit Ct, the six variable capacitance elements C1 to C6 can be regarded as the variable capacitance elements connected in series with respect to high frequency.

On the other hand, in the case of applying a direct-current voltage to the first variable capacitance element unit Ct1 in FIG. 1 where Ct of FIG. 5B is used as Ct1 of FIG. 1 and the input terminal IN of FIG. 5B is used on a bias terminal V1 side while the output terminal OUT thereof is used on a ground side, and with reference also to FIG. 1, the direct-current voltage for controlling the capacitance components of the variable capacitance elements C1 and C2 is supplied from a bias terminal V1 through a resistor component of the first bias supply circuit R1 and then through the first variable capacitance element C1, the second variable capacitance element C2, and the second bias lines B43 and B41, thus being applied between the bias terminal V1 and the ground. Also to the third to sixth variable capacitance elements C3 to C6, the direct-current voltage is applied respectively through the first bias lines B31 to B33 and the second bias lines B41 to B43 as in the case of FIG. 5A. That is to say, the direct-current voltage for controlling the capacitance component of the third variable capacitance element C3 is applied between the bias terminal V1 and the ground by way of the first bias lines B31 and B32, the third variable capacitance element C3, and the second bias lines B43 and B11. The direct-current voltage for controlling the capacitance component of the fourth variable capacitance element C4 is applied between the bias terminal V1 and the ground by way of the first bias lines B31 and B32, the fourth variable capacitance element C4, and the second bias lines B42 and B41. The direct-current voltage for controlling the capacitance component of the fifth variable capacitance element C5 is applied between the bias terminal V1 and the ground by way of the first bias lines B31 and B33, the fifth variable capacitance element C5, and the second bias lines B43 and B41. The direct-current voltage for controlling the capacitance component of the sixth variable capacitance element C6 is applied between the bias terminal V1 and the ground by way of the first bias lines B31 and B33 and the sixth variable capacitance element C6. As just described, in the case where the direct-current voltage is applied to the variable capacitance element unit Ct, the direct-current voltage of which level is equal to that of the direct-current voltage applied to Ct1 is applied to the group consisting of C1 and C2 as well as to C3, C4, C5, and C6, with the result that these can be regarded as being connected in parallel with respect to direct current.

In this case, for determining the variable capacitance capacitors so that the number of variable capacitance capacitors connected in series with respect to high frequency becomes equal to the number of variable capacitance capacitors connected in parallel with respect to direct current, the group consisting of C1 and C2 is used as one variable capacitance capacitor while each of C3, C4, C5, and C6 are respectively used as a variable capacitance capacitor, thereby making the number of variable capacitance capacitors connected in series with respect to high frequency equal to the number of variable capacitance capacitors connected in parallel with respect to direct current. Hence, the variable capacitance element unit in FIG. 5B has the five variable capacitance capacitors connected in series with respect to high frequency and in parallel with respect to direct current.

The first variable capacitance element unit has the variable capacitance capacitors which are connected in parallel with respect to direct current and to each of which the direct-current voltage is therefore applied at the same level with respect to direct current, so that predetermined capacitance component can be obtained. As a result, the direct-current voltage for controlling the capacitance of the variable capacitance capacitor to a desired value can be stably supplied to the respective variable capacitance capacitors separately, and the dielectric constant of the thin-film dielectric layer can be changed desirably by application of the direct-current voltage. As just described, the first variable capacitance element unit is a variable capacitance element unit where capacitance components are easily controlled, and the variable capacitance element unit can therefore set, for example, an impedance of desired characteristic, thereby masking it possible to provide the variable capacitance circuit of the invention having the unit, with variable characteristics.

Further, the first variable capacitance element unit has the variable capacitance capacitors connected in series with respect to high frequency, with the result that the high frequency signal inputted to the variable capacitance element unit Ct, that is, the high frequency signal applied to the variable capacitance capacitors, will not leak through the first bias lines B11 to B13 and the second bias lines B21 to B23 because as shown in FIG. 5A, the resistor components R11 to R13 and R21 to R23 serve as high impedance components for impedance in the frequency region of high frequency signals. For example, the variable capacitance capacitor Ct is used at a frequency of 1 GHz and the capacitance of the variable capacitance elements C1 to C5 is set at 5 pF in FIG. 5A, and in this case, in order to avoid harmful influences on the impedance from one tenth of the above frequency (100 MHz), the thin-film resistors 61 to 66 of FIG. 1 will be set to have resistance values more than ten times the impedance of the variable capacitance elements C1 to C5 at 100 MHz, and then, required resistance values of the first and second bias lines B11, B12, B13, B21, B22, and B23 will be about 3.2 kΩ or more.

As described above, the direct-current voltage is stably applied to the variable capacitance elements C1 to C5 independently, which allows for the best use of the rate of direct-current voltage-induced capacitance change in each of the variable capacitance elements C1 to C5 and allows for controls of impedance, resonant frequency, and the like.

Accordingly, the high frequency voltage applied to these variable capacitance capacitors connected in series is divided for the respective variable capacitance capacitors, resulting in a lower high frequency voltage applied to each of the variable capacitance capacitors. This allows for a decrease in capacitance change caused by the high frequency signal and allows for reduction in waveform distortion, intermodulation distortion, or the like, of the variable capacitance circuit.

Further, owing to the series connection of the variable capacitance capacitors, it is possible to obtain the same effects with respect to high frequency as those given by an increase in thickness of the dielectric layer of the capacitance element, and also possible to decrease a calorific valve per unit volume due to loss resistance of the variable capacitance element unit as well as to enhance power handling capability of the variable capacitance circuit.

(Second Variable Capacitance Element Unit)

The second variable capacitance element unit represents either the second variable capacitance element unit (referred to as the second variable capacitance element unit A) having m pieces (where m is a natural number smaller than n) of the variable capacitance elements connected in series or the second variable capacitance element unit (referred to as the second variable capacitance element unit B) composed of one piece of the variable capacitance element. Note that m is a natural number which does not include zero.

Figure 6:
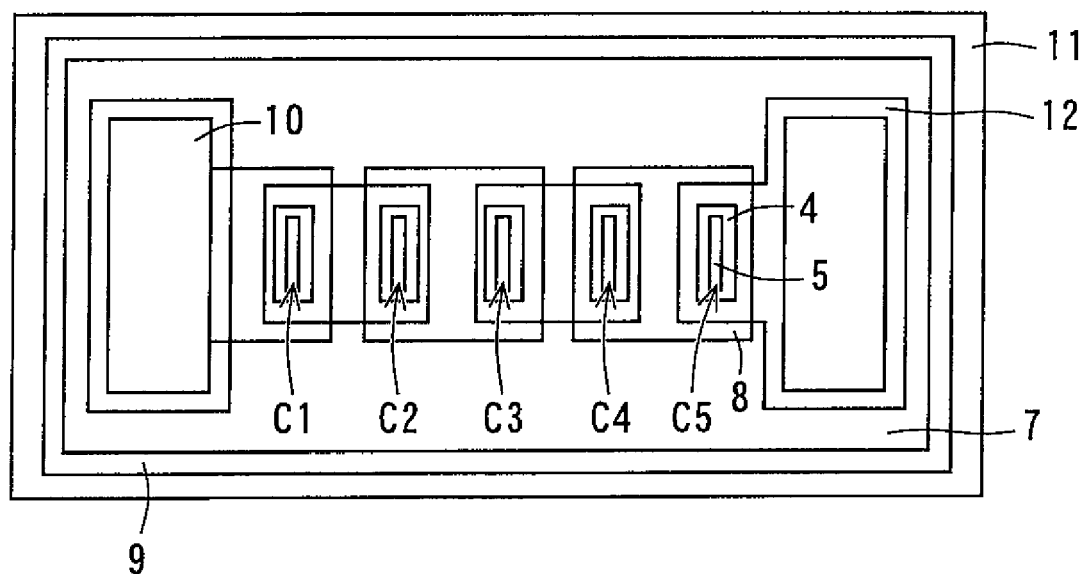
FIG. 6 is a perspective view showing one example of the second variable capacitance element unit.

The second variable capacitance element unit A only needs to satisfy the above requirements and preferably has m pieces of the variable capacitance elements on one supporting substrate as shown in FIG. 6, for example, especially for advantages such as easy handling, downsizing, and cost reduction. Note that the second variable capacitance element unit in FIG. 6 represents a unit composed of five variable capacitance elements having no bias lines, to which the unit is not limited.

For example, in the case where a capacitance element such as a direct-current-limiting capacitance element except the variable capacitance element exists in the series connection of the variable capacitance elements, the second variable capacitance element unit A represents the second variable capacitance element unit A including these capacitance elements, and the voltage amplitude of high frequency signal of such unit A is measured.

Among the units having the variable capacitance elements connected in series, a unit (referred to as the second variable capacitance element unit A') preferably used in particular as the second variable capacitance element unit A has, as in the case of the variable capacitance element unit shown in FIGS. 5A and 5B, o pieces (where o is a natural number smaller than n) of the variable capacitance capacitors each composed of one or more pieces of the variable capacitance elements, which capacitors are connected in series with respect to high frequency and in parallel with respect to direct current. That is to say, it is preferable that the second variable capacitance element unit include: o pieces (where o is a natural number smaller than n) of the variable capacitance capacitors connected in series, each of which variable capacitance capacitors is composed of one or more variable capacitance elements; the first bias line on a high potential side of direct-current voltage; and the second bias line on a low potential side of direct-current voltage, where the first bias line and the second bias line are alternately connected to both ends of a plurality of the variable capacitance capacitors and between the respective variable capacitance capacitors. In particular, as in the case of the variable capacitance element unit shown in FIGS. 5A and 5B, it is preferable that the first bias line connect the input-side terminals of the odd-numbered variable capacitance capacitors and that the second bias line connect the output-side terminals of the odd-numbered variable capacitance capacitors. This is preferable because the above setting allows for an increase in the rate of capacitance change at the same direct-current voltage, therefore leading to an effect that the control range (variable range) of impedance or resonant frequency becomes wider. Note that the above-described matters of the first variable capacitance element unit apply to the second variable capacitance element unit A'.

The second variable capacitance element unit B is composed of one piece of the variable capacitance element. Herein, the second variable capacitance element unit composed of one piece of the variable capacitance element represents a unit having one piece of the variable capacitance element not adjacent to another variable capacitance element. Because the second variable capacitance element unit B is composed of one variable capacitance element, it has advantages of being smaller in size as well as consuming less current.

As described above, in the case of using the second variable capacitance element unit having the variable capacitance capacitors connected in series with respect to high frequency and in parallel with respect to direct current as in the first variable capacitance element unit, the direct-current voltage of which amplitude is equal to the direct-current voltage applied to the second variable capacitance element unit is applied to each of the variable capacitance capacitors, therefore allowing for the best use of the rage of capacitance change, with the result that the occurrence of distortion can be reduced and furthermore, the power consumption can be reduced, leading to a variable capacitance circuit which is excellent in power handling capability with a low loss, low current consumption, and high rate of capacitance change.

Note that the invention is not limited to the above examples of embodiments and may be subjected to various modification without departing from the scope of the invention. For example, in the above embodiment, the configuration of the output matching network may be modified to a multistage structure in which an LC low-pass type, an LC high-pass type, a π type, a T type, an LC resonance type, and the like are combined. Moreover, the configuration of the variable capacitance circuit may be a filter, a duplexer in which a Tx filter and a Rx filter are combined, an antenna module in which an antenna and a matching network are combined, or the like.

The invention may be embodied in other various forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. A variable capacitance circuit in which capacitance is controlled, comprising:
    a first variable capacitance section; and
    a second variable capacitance section;
    wherein the first variable capacitance section comprises a first variable capacitance element unit including n pieces, where n is a natural number of two or more, of variable capacitance capacitors connected in series in view of a first high frequency flow path and in parallel in view of a first direct current flow path, and
    the variable capacitance capacitors comprises one or more variable capacitance elements, each of which includes a dielectric layer having a dielectric constant varying according to a first applied direct-current voltage, and a pair of electrodes sandwiching the dielectric layer therebetween, and
    wherein the second variable capacitance section comprises a second variable capacitance element unit which has an applied voltage amplitude smaller than a voltage amplitude of high frequency signal applied to the first variable capacitance element unit, and
    the second variable capacitance unit comprises one or m pieces, where m is a natural number smaller than n, of variable capacitance elements connected, each of which includes a dielectric layer having a dielectric constant varying according to a second applied direct-current voltage and a pair of electrodes sandwiching the dielectric layer therebetween.

2. The variable capacitance circuit of claim 1 wherein the second variable capacitance element unit has m pieces of the variable capacitance elements connected in series, and wherein the second variable capacitance element unit comprises o pieces, where o is a natural number smaller than n, of the variable capacitance capacitors comprising one or more of the variable capacitance elements connected in series in view of a second high frequency flow path and connected in parallel in view of a second direct current flow path.

3. The variable capacitance circuit of claim 1, wherein,
the voltage amplitude of high frequency signal applied to the first variable capacitance element unit is maximum, and
the voltage amplitude of high frequency signal applied to the second variable capacitance element unit is minimum.

4. The variable capacitance circuit of claim 1, wherein circuits are connected to an input side and an output side, respectively, of the variable capacitance circuit, and
the variable capacitance circuit is operative to be a matching network by using capacitance variation of the variable capacitance elements.

5. The variable capacitance circuit of claim 1, wherein the variable capacitance circuit operative to be a resonant circuit by using capacitance variation of the variable capacitance elements.

6. The variable capacitance circuit of claim 1, wherein circuits are connected to an input side and an output side, respectively, of the variable capacitance circuit, and
the variable capacitance circuit is operative to a phase shifting circuit by using capacitance variation of the variable capacitance elements.

7. A variable capacitance circuit in which capacitance value is controlled, comprising:
a first variable capacitance section; and
a second variable capacitance section,
wherein the first variable capacitance section comprises a first variable capacitance element unit including:
n pieces, where n is a natural number of two or more, of variable capacitance capacitors connected in series, each of which comprises one or more variable capacitance elements which include a dielectric layer having a dielectric constant varying according to a first applied direct-current voltage, and a pair of electrodes sandwiching the dielectric layer therebetween; and
a first bias line on a high potential side of the first direct-current voltage and a second bias line on a low potential side of the first direct-current voltage, the first bias line and the second bias line being alternately connected to both ends of an array of the variable capacitance capacitors and between the respective variable capacitance capacitors of the array, and
wherein the second variable capacitance section comprises a second variable capacitance element unit which has an applied voltage amplitude smaller than a voltage amplitude of high frequency signal applied to the first variable capacitance element unit, the second variable capacitance element unit comprising one or m pieces, where m is a natural number smaller than n, of the variable capacitance elements connected in series, each of which includes a dielectric layer having a dielectric constant varying according to a second applied direct-current voltage, and includes a pair of electrodes sandwiching the dielectric layer therebetween.

8. The variable capacitance circuit of claim 7, wherein the second variable capacitance element unit is a variable capacitance element unit having m pieces of the variable capacitance elements connected in series, and wherein the second variable capacitance element unit comprises:
o pieces, where o is a natural number smaller than n, of variable capacitance capacitors connected in series, each of which comprises one or more variable capacitance elements; and
a third bias line on a high potential side of the second direct-current voltage and a fourth bias line on a low potential side of the second direct-current voltage, the third bias line and the fourth bias line being alternately connected to both ends of an array of the variable capacitance capacitors and between the respective variable capacitance capacitors of the array.

9. The variable capacitance circuit of claim 7, wherein in the variable capacitance circuit,
the voltage amplitude of high frequency signal applied to the first variable capacitance element unit is maximum, and
the voltage amplitude of high frequency signal applied to the second variable capacitance element unit is minimum.

10. The variable capacitance circuit of claim 7, wherein circuits are connected to an input side and an output side, respectively, of the variable capacitance circuit, and
the variable capacitance circuit is operative to be a matching network by using capacitance variation of the variable capacitance elements.

11. The variable capacitance circuit of claim 7, wherein the variable capacitance circuit is operative to be a resonant circuit by using capacitance variation of the variable capacitance elements.

12. The variable capacitance circuit of claim 7, wherein circuits are connected to an input side and an output side, respectively, of the variable capacitance circuit, and
the variable capacitance circuit is operative to be a phase shifting circuit by using capacitance variation of the variable capacitance elements.

13. A method of adjusting the number of variable capacitance elements in a variable capacitance circuit, comprising:
measuring voltage amplitude values in a plurality of variable capacitance sections, each including one or plural variable capacitance elements and then comparing the voltage amplitude values in the variable capacitance sections; and
selecting two variable capacitance sections having different voltage amplitude values among the plurality of the variable capacitance sections, and then reducing the number of variable capacitance elements in one of the selected variable capacitance section, which has a smaller voltage amplitude value than the other of the selected variable capacitance section.

14. The method of claim 13, wherein an act of selecting two variable capacitance sections having different voltage amplitude values among the plurality of the variable capacitance sections comprises selecting a variable capacitance section having a maximum voltage amplitude value and a variable capacitance section having a minimum voltage amplitude value.

15. The method of claim 13, wherein the variable capacitance section comprises:
n pieces, where n is a natural number of two or more, of variable capacitance capacitors, each including a dielectric layer with dielectric constant varying according to an applied direct-current voltage, and a pair of electrodes sandwiching the dielectric layer therebetween; and a first bias line on a high potential side of the applied direct-current voltage and a second bias line on a low potential side of the applied direct-current voltage, the first bias line and the second bias line being alternately connected to both ends of an array of variable capacitance capacitors and between the respective variable capacitance capacitors of the array.

* * * * *